United States Patent
Yamada et al.

(10) Patent No.: US 11,792,937 B2
(45) Date of Patent: Oct. 17, 2023

(54) COMPONENT BUILT-IN WIRING SUBSTRATE

(71) Applicant: IBIDEN CO., LTD., Gifu (JP)

(72) Inventors: Takahiro Yamada, Ogaki (JP); Seiji Izawa, Ogaki (JP); Katsuyuki Sano, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 17 days.

(21) Appl. No.: 17/469,124

(22) Filed: Sep. 8, 2021

(65) Prior Publication Data

US 2022/0087024 A1 Mar. 17, 2022

(30) Foreign Application Priority Data

Sep. 11, 2020 (JP) .................................. 2020-152833

(51) Int. Cl.
*H05K 1/18* (2006.01)
*H05K 1/11* (2006.01)

(52) U.S. Cl.
CPC ............. *H05K 1/183* (2013.01); *H05K 1/113* (2013.01); *H05K 1/185* (2013.01); *H05K 2201/096* (2013.01)

(58) Field of Classification Search
CPC .......... H05K 1/18; H05K 1/183; H05K 1/113; H05K 1/185; H05K 2201/096

USPC ........................................................ 361/761
See application file for complete search history.

(56) References Cited

U.S. PATENT DOCUMENTS

2017/0263571 A1* 9/2017 Ishihara ................ H01L 23/552

FOREIGN PATENT DOCUMENTS

JP 2016-039214 A 3/2016

* cited by examiner

*Primary Examiner* — Tremesha S Willis
(74) *Attorney, Agent, or Firm* — Oblon, McClelland, Maier & Neustadt, L.L.P.

(57) ABSTRACT

A component built-in wiring substrate includes a first insulating layer, a first conductor layer formed on a first surface of the first insulating layer and including a component mounting pad, a second conductor layer formed on a second surface of the first insulating layer on the opposite side with respect to the first surface, via conductors formed in the first insulating layer such that the via conductors are connecting the second conductor layer and the component mounting pad of the first conductor layer, a second insulating layer formed on the first insulating layer and having a component accommodating portion penetrating through the second insulating layer such that the component mounting pad is positioned at bottom of the accommodating portion, and an electronic component positioned in the accommodating portion of the second insulating layer such that the electronic component is mounted on the component mounting pad of the first conductor layer.

20 Claims, 7 Drawing Sheets

COMPONENT BUILT-IN WIRING SUBSTRATE

CROSS-REFERENCE TO RELATED APPLICATIONS

The present application is based upon and claims the benefit of priority to Japanese Patent Application No. 2020-152833, filed Sep. 11, 2020, the entire contents of which are incorporated herein by reference.

BACKGROUND OF THE INVENTION

Field of the Invention

The present invention relates to a component built-in wiring substrate.

Description of Background Art

Japanese Patent Application Laid-Open Publication No. 2016-39214 describes an electronic component built-in substrate in which an electronic component is accommodated in a cavity formed in a build-up wiring board. The electronic component is mounted on a solid plain layer that forms the entire bottom surface of the cavity, and is sealed in the cavity by an insulating layer that is laminated on the electronic component. The entire contents of this publication are incorporated herein by reference.

SUMMARY OF THE INVENTION

According to one aspect of the present invention, a component built-in wiring substrate includes a first resin insulating layer, a first conductor layer formed on a first surface of the first resin insulating layer and including a component mounting pad, a second conductor layer formed on a second surface of the first resin insulating layer on the opposite side with respect to the first surface of the first resin insulating layer, via conductors formed in the first resin insulating layer such that the via conductors are connecting the second conductor layer and the component mounting pad of the first conductor layer, a second resin insulating layer formed on the first resin insulating layer and having a component accommodating portion penetrating through the second resin insulating layer such that the component mounting pad is positioned at bottom of the component accommodating portion, and an electronic component positioned in the component accommodating portion of the second resin insulating layer such that the electronic component is mounted on the component mounting pad of the first conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
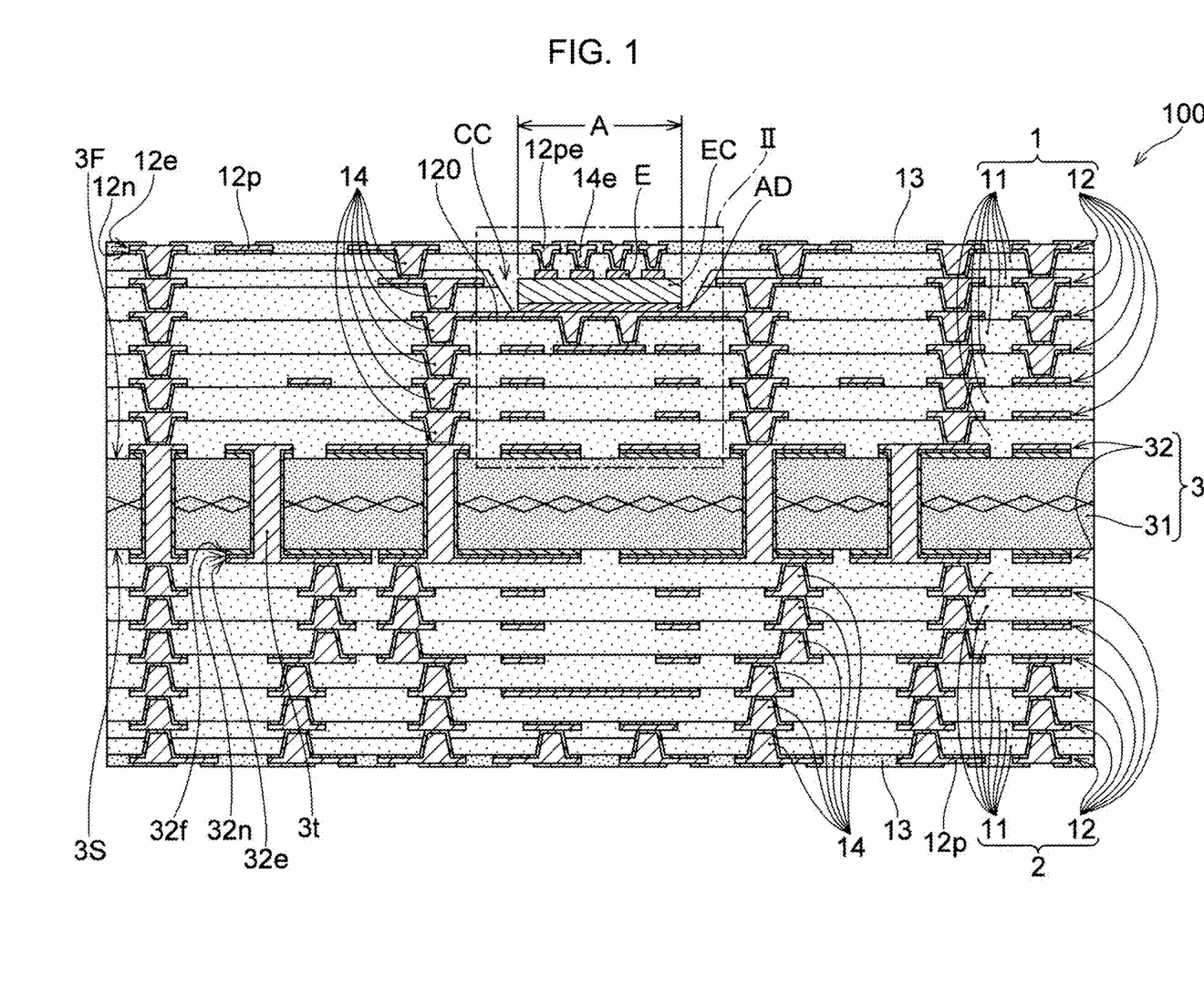
FIG. 1 is a cross-sectional view illustrating an example of a component built-in wiring substrate according to an embodiment of the present invention.
Figure 2A:
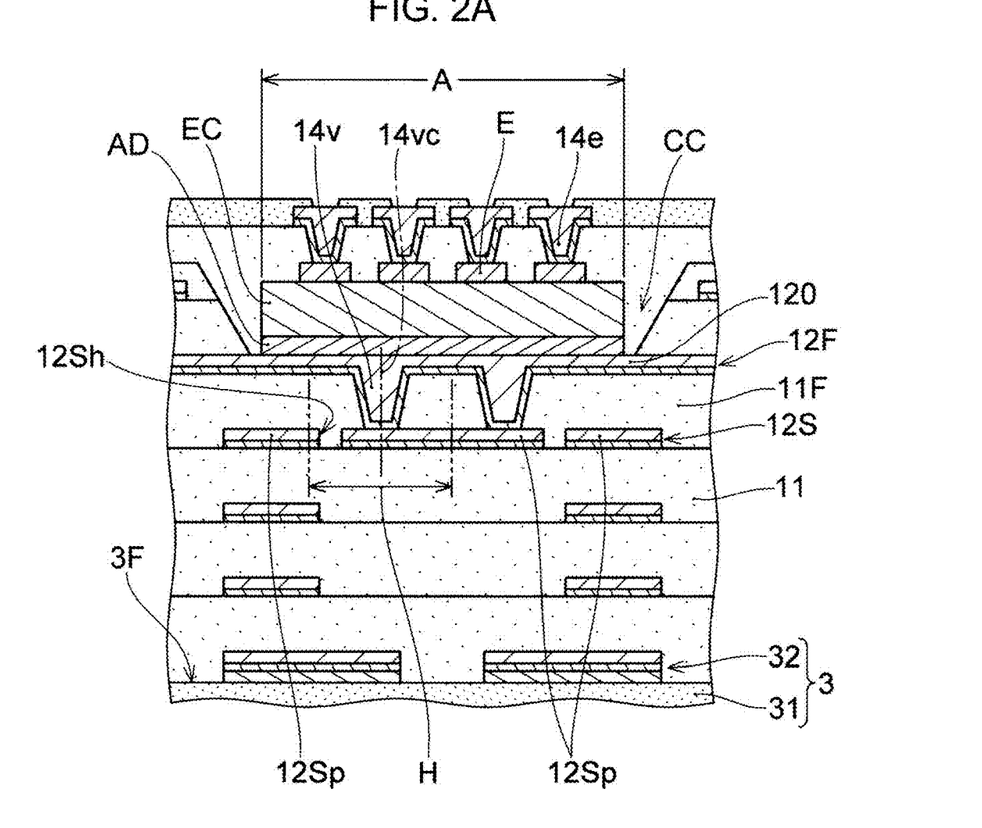
FIG. 2A is an enlarged view of an electronic component and a lower-layer portion of the electronic component in the component built-in wiring substrate of FIG. 1.

A component built-in wiring substrate according to an embodiment of the present invention is described with reference to the drawings. FIG. 1 is a cross-sectional view illustrating a component built-in wiring substrate 100, which is an example of the component built-in wiring substrate of the embodiment. FIG. 2A illustrates an enlarged view of a portion (II) of FIG. 1. The component built-in wiring substrate of the present embodiment is also simply referred to as a "wiring substrate."

As illustrated in FIG. 1, the component built-in wiring substrate 100 has a core substrate 3 having two main surfaces (a first surface (3F) and a second surface (3S) on the opposite side with respect to the first surface (3F)) opposing each other in a thickness direction thereof. The component built-in wiring substrate 100 includes a first build-up part 1 laminated on the first surface (3F) of the core substrate 3 and a second build-up part 2 laminated on the second surface (3S) of the core substrate 3. The core substrate 3 includes a resin insulating layer 31 (core substrate insulating layer), and conductor layers 32 (core substrate conductor layers) that are respectively laminated on the first build-up part 1 side and the second build-up part 2 side of the resin insulating layer 31. The first surface (3F) is formed by an exposed surface of the conductor layer 32 on the first build-up part 1 side and an exposed portion of a surface of the resin insulating layer 31 on the first build-up part 1 side. The second surface (3S) is formed by an exposed surface of the conductor layer 32 on the second build-up part 2 side and an exposed portion of a surface of the resin insulating layer 31 on the second build-up part 2 side. The resin insulating layer 31 includes through-hole conductors (3t) that penetrate the resin insulating layer 31 and connect the conductor layer 32 on the first surface (3F) side and the conductor layer 32 on the second surface (3S) side to each other.

The first build-up part 1 and the second build-up part 2 each include multiple resin insulating layers 11 and multiple conductor layers 12. In each of the first and second build-up parts (1, 2), the multiple resin insulating layers 11 and the multiple conductor layers 12 are alternately laminated. In the wiring substrate 100 of FIG. 1, the first build-up part 1 includes six conductor layers 12 and seven resin insulating layers 11. Similarly, the second build-up part 2 includes six conductor layers 12 and seven resin insulating layers 11. The first build-up part 1 and the second build-up part 2 include via conductors 14 that each penetrate a resin insulating layer 11 and connect to each other conductor layers (12, 32) that are adjacent to each other via the resin insulating layer 11. The component built-in wiring substrate 100 includes covering layers (solder resist layers) 13 that respectively cover upper sides of the first build-up part 1 and the second build-up part 2. The covering layers 13 have openings that expose conductor pads (12p) of the outermost conductor layers 12 (the conductor layers 12 farthest from the core substrate 3) of the first and second build-up parts (1, 2).

In the description of the embodiment, a side farther from the core substrate insulating layer 31 in the thickness direction of the wiring substrate is also referred to as an "upper side" or "outer side," or simply "upper" or "outer," and a side closer to the core substrate insulating layer 31 is also referred to as a "lower side" or "inner side," or simply "lower" or "inner." Further, for the conductor layers and the resin insulating layers, a surface facing the opposite side with respect to the core substrate insulating layer 31 is also referred to as an "upper surface," and a surface facing the core substrate insulating layer 31 side is also referred to as a "lower surface." Therefore, for example, in the description of the first build-up part 1 and the second build-up part 2, a side farther from the core substrate 3 is also referred to as an "upper side," "upper-layer side," or "outer side," or simply "upper" or "outer," and a side closer to the core substrate 3 is also referred to as a "lower side," "lower-layer side," or "inner side," or simply "lower" or "inner."

The resin insulating layer 31 and the resin insulating layers 11 are each formed of any insulating resin. Examples of the insulating resin include an epoxy resin, a bismaleimide triazine resin (BT resin), a phenol resin, and the like. In the example of FIG. 1, the resin insulating layer 31 contains a core material (reinforcing material) formed of a glass fiber or an aramid fiber. Although not illustrated in FIG. 1, any one of the resin insulating layers 11 may contain a core material formed of a glass fiber or the like. The resin insulating layers 31 and resin insulating layers 11 may each further contain inorganic filler. Examples of the inorganic filler contained in each of the resin insulating layers include fine particles formed of silica ($SiO_2$), alumina, or mullite. The covering layers 13 are formed, for example, using any insulating material such as an epoxy resin or a polyimide resin.

The conductor layers 32 and the conductor layers 12, as well as the through-hole conductors (3t) and the via conductors 14, are formed using any metal such as copper or nickel. In the example of FIG. 1, the conductor layers 32 each include a metal foil (32f), a metal film (32n), and a plating film (32e). The through-hole conductors (3t) are each formed of a metal film (32n) and a plating film (32e). Further, the conductor layers 12 and the via conductors 14 each include a metal film (12n) and a plating film (12e). Examples of the metal foil (32f) include a copper foil and a nickel foil. The plating films (32e, 12e) are, for example, electrolytic plating films. The metal films (32n, 12n) are, for example, electroless plating films or sputtering films, and respectively function as power feeding layers when the plating films (32e, 12e) are formed by electrolytic plating.

The wiring substrate 100 of the present embodiment has a built-in electronic component (EC). The electronic component (EC) is placed on a component mounting pad 120 included in any one of the conductor layers 12 in the first build-up part 1. In the illustrated example, the electronic component (EC) is accommodated in a component accommodating part (recess part) (CC), which penetrates the resin insulating layer 11 that is in contact with an upper surface of the component mounting pad 120, and of which a bottom part is formed by the component mounting pad 120. The electronic component (EC) is sealed in the component accommodating part (CC) by the outermost resin insulating layer 11 of the first build-up part 1. Examples of the electronic component (EC) include active components such as semiconductor devices and passive components such as resistors. It is also possible that the electronic component (EC) is a wiring material including fine wirings formed on a semiconductor substrate.

The electronic component (EC) is bonded to the component mounting pad 120 via an adhesive (AD). For the adhesive (AD), any material can be used. Examples of the adhesive (AD) include: a conductive adhesive containing a metal such as solder, gold, or copper, or containing any conductive particles such as silver particles; an insulating adhesive simply formed of an epoxy resin or the like; and the like. In the illustrated example, the electronic component (EC) includes electrodes (E), which are used to connect the electronic component (EC) to an external circuit. In the example illustrated in FIG. 1, in the resin insulating layer 11 directly formed on the electronic component (EC), via conductors (14e) are formed at positions corresponding to the electrodes (E). The via conductors (14e) are integrally formed with the outermost conductor layer 12 of the first build-up part 1 and respectively connect the electrodes (E) to connection pads (12pe).

Figure 2B:
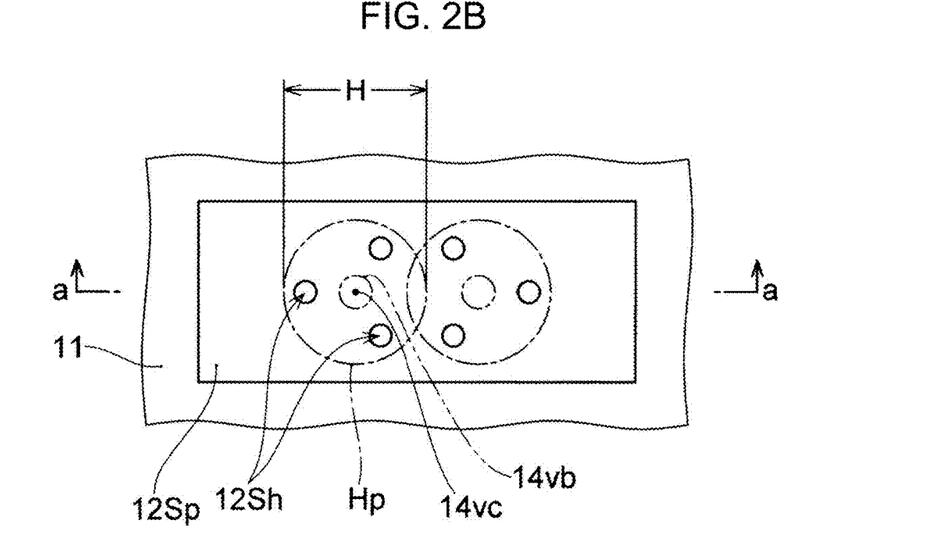
FIG. 2B is a plan view of a second conductor pattern in the component built-in wiring substrate shown in FIG. 2A.
Figure 3:
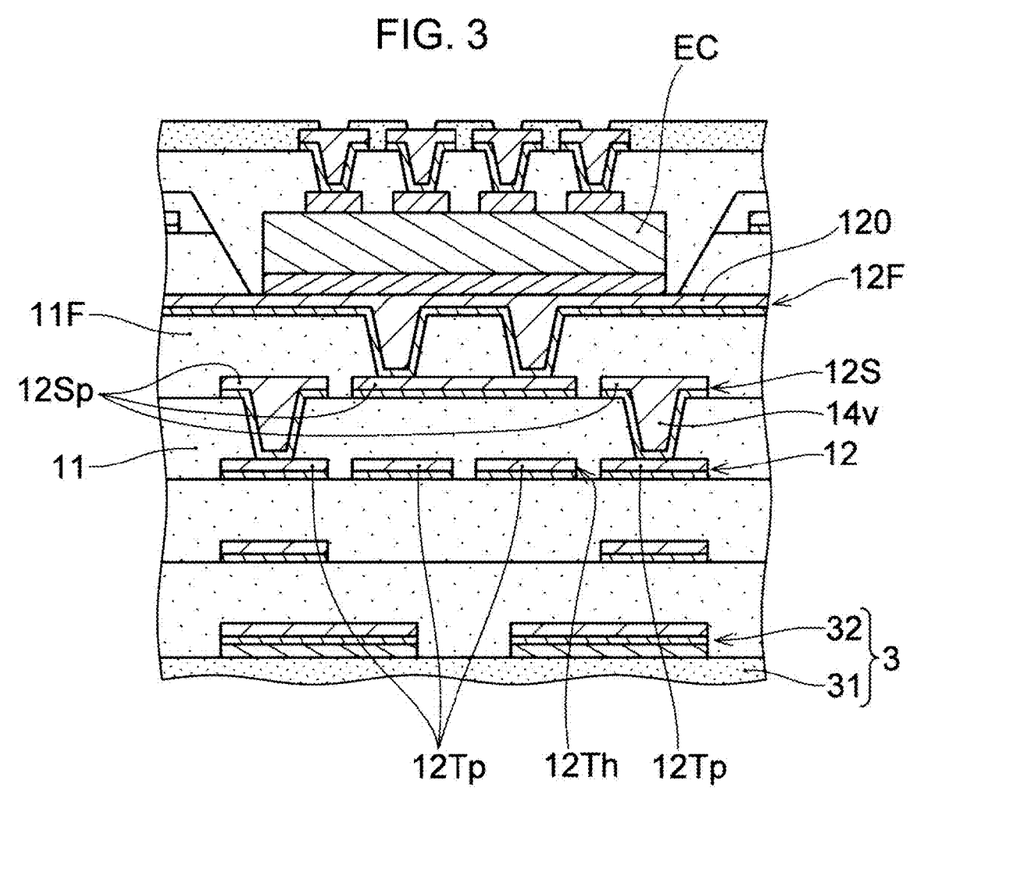
FIG. 3 is a partially enlarged view of a component built-in wiring substrate according to an embodiment of the present invention.

FIG. 2A is an enlarged view of a portion (II) surrounded by a one-dot chain line of the component built-in wiring substrate 100 illustrated in FIG. 1. FIG. 2B is a plan view of the conductor layer indicated by a reference numeral "12S" in FIG. 2A as viewed from above. Further, FIG. 3 is a partially enlarged view corresponding to another example of the component built-in wiring substrate of the present embodiment. In the following description with reference to FIGS. 2A, 2B and 3, the conductor layer 12 that includes the component mounting pad 120 is referred to as the first conductor layer (12F). The resin insulating layer 11 directly below the first conductor layer (12F) is referred to the first resin insulating layer (11F). The first conductor layer (12F) is formed on a surface of the first resin insulating layer (11F) on the opposite side with respect to the core substrate 3. The conductor layer 12 directly below the first resin insulating layer (11F), that is, the conductor layer 12 formed on a surface of the first resin insulating layer (11F) on the opposite side with respect to the surface on which the first conductor layer (12F) is formed is referred to as the second conductor layer (12S). The first conductor layer (12F) is connected to the second conductor layer (12S) via via conductors (14v) that penetrate the first resin insulating layer (11F). Specifically, the component mounting pad 120 included in the first conductor layer (12F) is connected to the second conductor layer (12S) via the multiple via conductors (14v) integrally formed with the component mounting pad 120.

The component mounting pad 120 included in the first conductor layer (12F) is a so-called solid pattern extending in all directions along the surface of the first resin insulating layer (11F) on the opposite side with respect to the core substrate 3. The component mounting pad 120 occupies a predetermined region of the surface of the first resin insulating layer (11F) on the opposite side with respect to the core substrate 3. The component mounting pad 120 is formed in a range including an entire region (component mounting region) (A) where the electronic component (EC) is to be placed. In the illustrated example, the component accommodating part (recess part) (CC) that accommodates the electronic component (EC) therein is formed to penetrate the resin insulating layer 11 in an upper side of the first conductor layer (12F), and the component mounting pad 120 forms the bottom part of the recess part (CC).

The second conductor layer (12S) connected to the component mounting pad 120 via the via conductors (14v) also has a solid pattern. Specifically, in a plan view in which the component mounting pad 120 is viewed from an upper side of the first build-up part 1, the second conductor layer (12S) has a solid pattern that extends over a region overlapping the region where the component mounting pad 120 is formed. The term "plan view" means viewing the wiring substrate 100 along its thickness direction. This solid pattern formed in the second conductor layer (12S) is referred to as a second conductor pattern (12Sp). The second conductor pattern (12Sp) included in the second conductor layer (12S) is connected to the component mounting pad 120 via the via conductors (14v). The second conductor pattern (12Sp) has through holes (12Sh) adjacent to connection parts between the via conductors (14v) and the second conductor pattern (12Sp).

The component mounting pad 120 is connected to the second conductor pattern (12Sp) formed on the opposite side via the first resin insulating layer (11F) by the via conductors (14v). Therefore, a defect such as peeling between the component mounting pad 120 and the first resin insulating layer (11F) can be suppressed. For example, in a process involving heating the adhesive (AD) when the electronic component (EC) is placed on the component mounting pad 120, peeling between the first resin insulating layer (11F) and the component mounting pad 120 due to a difference in thermal expansion coefficient between the first resin insulating layer (11F) and the first conductor layer (12F) may occur. However, since the component mounting pad 120 and the second conductor pattern (12Sp) are connected via the via conductors (14v), the component mounting pad 120 and the first resin insulating layer (11F) relatively firmly adhere to each other. Therefore, occurrence of peeling between the first resin insulating layer (11F) and the component mounting pad 120 can be suppressed.

The through holes (12Sh) are formed adjacent to the connection parts between the via conductors (14v) and the second conductor pattern (12Sp). By providing the through holes (12Sh), occurrence of a defect such as peeling or floating between the second conductor pattern (12Sp) and the resin insulating layer 11 directly below the second conductor pattern (12Sp) can be suppressed. The reason for this is described in detail below.

A resin such as epoxy resin used for the resin insulating layers 11 of the wiring substrate 100 is hygroscopic. Therefore, the resin insulating layers 11 absorb moisture in an amount according to humidity or exposure time in an exposure atmosphere in a lamination process of the resin insulating layers 11. When such a resin that has absorbed moisture is placed in an environment with rising temperature, the absorbed moisture vaporizes and is released to outside of the wiring substrate 100. However, when a conductor pattern is continuously formed over a relatively wide range in a conductor layer 12 (for example, the component mounting pad 120, or the second conductor pattern (12Sp)), a release route of the vaporized moisture to the outside of the wiring substrate 100 is obstructed. Therefore, the vaporized moisture is likely to accumulate at an interface between a conductor pattern of a conductor layer 12 and a resin insulating layer 11 directly below the conductor layer 12. Due to expansion associated with the vaporization of the moisture retained at the interface between the conductor layer 12 and the resin insulating layer 11 directly below the conductor layer 12, the conductor layer 12 may be pushed up, causing peeling or floating to occur.

However, as illustrated in FIG. 2, in the wiring substrate 100, the through holes (12Sh) are formed in the second conductor pattern (12Sp). Therefore, the moisture retained at the interface between the second conductor pattern (12Sp) and the resin insulating layer 11 directly below the second conductor pattern (12Sp) is dispersed to the first resin insulating layer (11F) side via the through holes (12Sh). Therefore, peeling or floating of the second conductor pattern (12Sp) from the resin insulating layer 11 can be prevented.

Moisture that moves toward the first resin insulating layer (11F) side through the through holes (12Sh) formed in the second conductor pattern (12Sp) can accumulate at the interface between the component mounting pad 120 and the first resin insulating layer (11F). The moisture may expand in a process involving heating or the like and push up the component mounting pad 120, causing peeling or floating between the component mounting pad 120 and the first resin insulating layer (11F). In order to prevent such peeling or floating of the component mounting pad 120, the multiple through holes (12Sh) are formed adjacent to the connection parts between the via conductors (14v) and the second conductor pattern (12Sp). Specifically, the multiple through holes (12Sh) are each formed in a region (H) within 500 μm from a center (14vc) of a nearest via conductor (14v). The through holes (12Sh) are formed, for example, simultaneously with pattern formation of the second conductor layer (12S), and each have a diameter of, for example, 150 μm or more and 300 μm or less.

FIG. 2B illustrates a plan view of the second conductor pattern (12Sp) in FIG. 2A. That is, FIG. 2B is a plan view when the second conductor pattern (12Sp) is viewed from an upper side in a state in which the structural elements above the first resin insulating layer (11F) in FIG. 2A are removed. FIG. 2A is a cross-sectional view when the component built-in wiring substrate 100 is cut along a cutting line that overlaps an a-a line illustrated in FIG. 2B. As illustrated in FIG. 2B, the multiple through holes (12Sh) are formed in the second conductor pattern (12Sp), which is a solid pattern extending along the surface of the resin insulating layer 11. The multiple through holes (12Sh) are formed inside circles that are each indicated by a one-dot chain line (Hp). The regions inside the circles indicated by the one-dot chain lines (Hp) are the regions (H) that are each within 500 μm from a center (14*vc*) of a connecting part (14*vb*), which is indicated by a two-dot chain line, between a via conductor (14*v*) and the second conductor pattern (12Sp). The number, formation patterns, and opening shapes of the through holes (12Sh) formed in the second conductor pattern (12Sp) are not limited to those illustrated in the drawings. The opening shape of each of the through holes (12Sh) is not limited to a circle and can be any shape such as a polygon.

When peeling or floating of the component mounting pad 120 from the first insulating layer (11F) occurs, flatness of a component mounting surface (upper surface) of the component mounting pad 120 may be impaired. However, in the component built-in wiring substrate 100, since the through holes (12Sh) are formed in the regions (H) adjacent to the via conductors (14*v*), moisture moving to the first resin insulating layer (11F) is guided to near the connecting parts between the component mounting pad 120 and the via conductors (14*v*), which have relatively firm structures. Therefore, peeling or floating at the interface between the component mounting pad 120 and the first resin insulating layer (11F) is unlikely to occur.

Figure 2C:
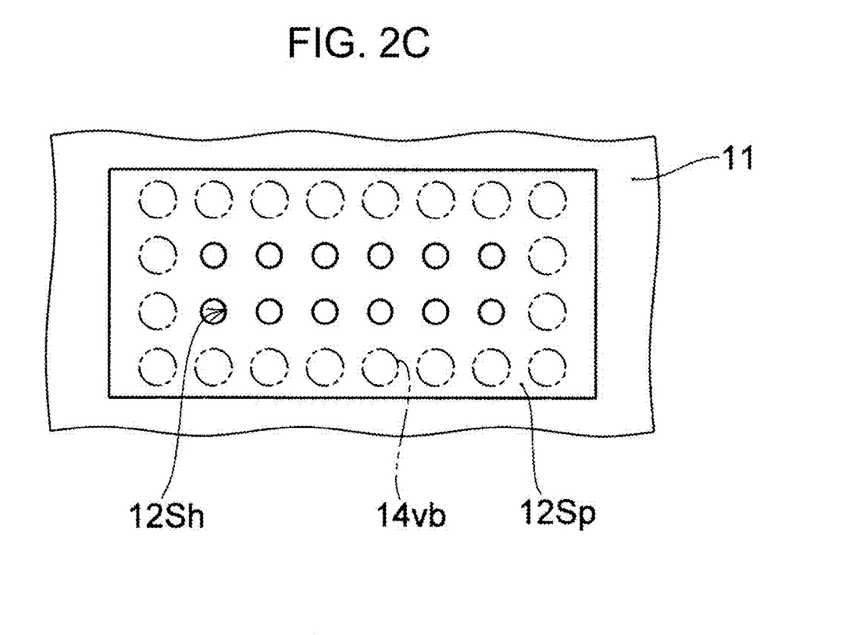
FIG. 2C is a plan view illustrating another example of the second conductor pattern.
Figure 2D:
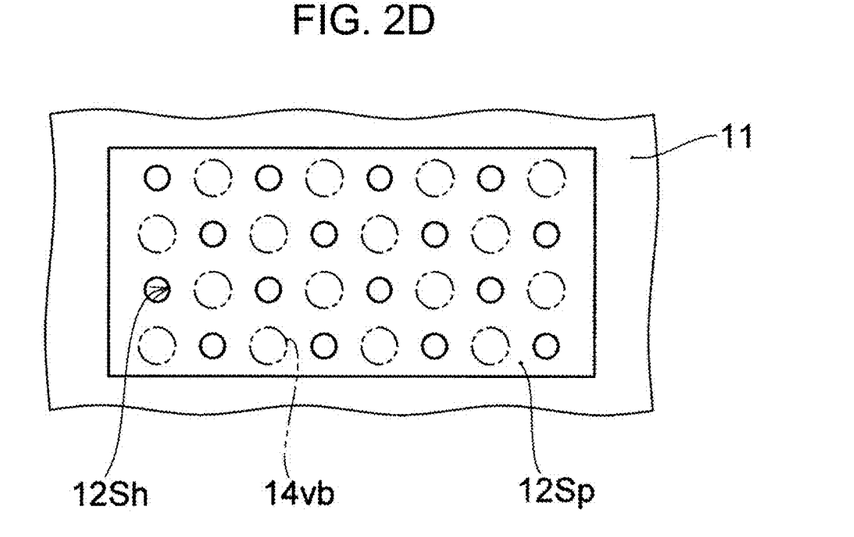
FIG. 2D is a plan view illustrating another example of the second conductor pattern.
Figure 2E:
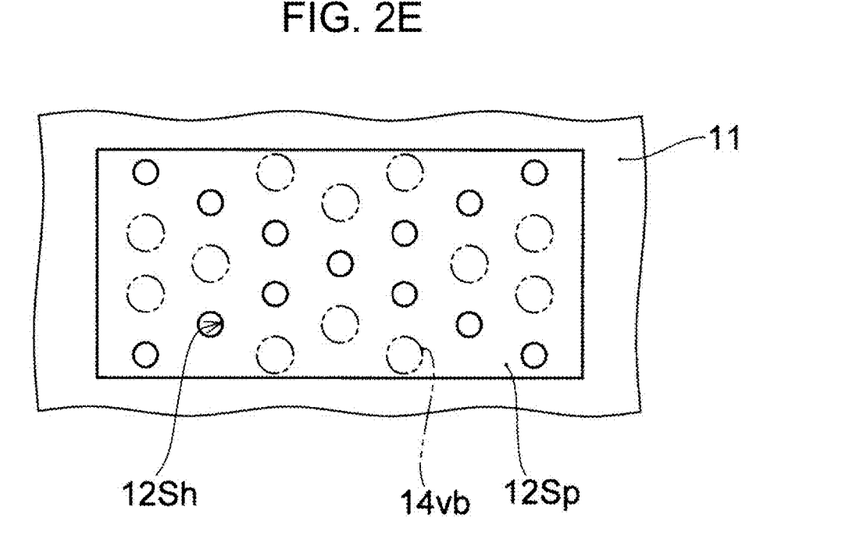
FIG. 2E is a plan view illustrating another example of the second conductor pattern.

A positional relationship between the multiple through holes (12Sh) formed in the second conductor pattern (12Sp) and the via conductors (14*v*) in a plan view is not limited to that illustrated in FIG. 2B. For example, the multiple through holes (12Sh) and the via conductors (14*v*) in a plan view may be formed as illustrated in FIGS. 2C-2E. In the example illustrated in FIG. 2C, the second conductor pattern (12Sp) is connected to the via conductors (14*v*) at a peripheral edge of the second conductor pattern (12Sp) in a plan view. Specifically, the connecting parts (14*vb*) between the second conductor pattern (12Sp) and the via conductors (14*v*) are provided at equal intervals in a frame shape along an outer periphery of the second conductor pattern (12Sp). And, the through holes (12Sh) are formed in a region surrounded by the connecting parts (14*vb*) between the second conductor pattern (12Sp) and the via conductors (14*v*) that are provided in a frame shape. With such a structure, while an effect of dispersing the moisture to the component mounting pad 120 side by the through holes (12Sh) is obtained, the component mounting pad 120 is relatively firmly connected to the second conductor pattern (12Sp). Therefore, peeling of the component mounting pad 120 from the first resin insulating layer (11F) can be more effectively suppressed.

In the example illustrated in FIG. 2D, in a plan view of the second conductor pattern (12Sp), the through holes (12Sh) and the via conductors (14*v*) are alternately formed in a grid pattern. That is, the through holes (12Sh) and the connecting parts (14*vb*) are formed in a checkerboard pattern. According to such a positioning of the through holes (12Sh) and the connecting parts (14*vb*), all the through holes (12Sh) can be formed relatively close to the via conductors (14*v*) in the second conductor pattern (12Sp). Therefore, as described above, the moisture moving through the through holes (12Sh) toward the first resin insulating layer (11F) is guided to near the connecting parts between the component mounting pad 120 and the via conductors (14*v*), and floating of the component mounting pad 120 can be effectively suppressed.

In the example illustrated in FIG. 2E, in a plan view of the second conductor pattern (12Sp), the through holes (12Sh) are formed in a radial pattern along diagonal lines of the second conductor pattern (12Sp) from a center to corners (four corners of a rectangle) of the second conductor pattern (12Sp). And, the via conductors (14*v*) are provided such that the connecting parts (14*vb*) between the second conductor pattern (12Sp) and the via conductors (14*v*) are positioned near centers of sides of the second conductor pattern (12Sp). According to such a structure, the through holes (12Sh) are formed at a high density near the center of the second conductor pattern (12Sp). Therefore, moisture is unlikely to accumulate directly below a region of the second conductor pattern (12Sp) corresponding a position in the component mounting pad 120 where the electronic component (EC) is placed. Peeling or floating of the second conductor pattern (12Sp), which may cause the flatness of the mounting surface of the component mounting pad 120 for the electronic component (EC) to be impaired, can be suppressed.

In FIGS. 2B-2E described above, the connecting parts (14*vb*) and the through holes (12Sh) in the second conductor pattern (12Sp) are schematically illustrated only for describing their positional relationship, and it is not intended to limit their relationship in shape or dimension. For example, the connecting parts (14*vb*) and the through holes (12Sh) may be formed in circular shapes having substantially the same diameter, or the through holes (12Sh) may be formed to have in a diameter larger than that of the connecting parts (14*vb*).

The component built-in wiring substrate 100 of the present embodiment has a relatively firm structure with good adhesion between the component mounting pad 120 and the first resin insulating layer (11F), in which the component mounting pad 120 is connected to the second conductor pattern (12Sp). In addition, a defect due to moisture in the wiring substrate is unlikely to occur. By dispersing moisture that is likely to accumulate directly below the second conductor pattern (12Sp) to the component mounting pad 120 side, occurrence of a defect such as peeling at the interface between the second conductor pattern (12Sp) and the resin insulating layer 11 can be suppressed, and further, peeling or floating of the component mounting pad 120 can also be suppressed. A good quality component built-in wiring substrate 100 can be provided in which the electronic component (EC) is precisely placed at a desired position in the component built-in wiring substrate 100.

FIG. 3 illustrates an example in which a solid pattern (third conductor pattern) (12Tp) is further formed in the conductor layer 12 on the core substrate 3 side of the second conductor pattern (12Sp). In the illustrated example, the second conductor pattern (12Sp) is connected to the third conductor pattern (12Tp) via the via conductors (14*v*). The third conductor pattern (12Tp) continuously extends over a region overlapping the second conductor pattern (12Sp) in a plan view. Similar to the second conductor pattern (12Sp), multiple through holes (12Th) are formed in the third conductor pattern (12Tp). By having such a structure, moisture vaporized below the third conductor pattern (12Tp) can be dispersed to near a lower surface of the third conductor pattern (12Tp), near a lower surface of the second conductor pattern (12Sp), and near a lower surface of the component mounting pad 120. Occurrence of a defect due to moisture accumulated near the component mounting pad 120 and the second conductor pattern (12Sp) can be further suppressed.

In the component built-in wiring substrate of the present embodiment, the first resin insulating layer (11F) directly below the component mounting pad 120 may include a core material (reinforcing material). It is considered that the first resin insulating layer (11F) can be improved in mechanical strength and occurrence of a defect such as a crack due to a stress that can be applied to the first resin insulating layer (11F) via the component mounting pad 120 when the electronic component (EC) is mounted can be suppressed. Examples of the core material include a glass fiber, an aramid fiber, and the like. These fibers forming the core material can have a form of a woven fabric or a non-woven fabric. It is considered that vapor accumulated in the resin insulating layer 11 is dispersed and adheres to fiber surfaces of the core material, and local concentration of vapor at the interface between the conductor layer 12 and the resin insulating layer 11 can be avoided. As in the example illustrated in FIG. 3, when the third conductor pattern (12Tp), which is a solid pattern, is formed and is connected to the second conductor pattern (12Sp), the resin insulating layer 11 between the second conductor pattern (12Sp) and the third conductor pattern (12Tp) preferably also contains a core material.

The first conductor layer (12F) that includes the component mounting pad 120 may be formed thicker than the other conductor layers of the component built-in wiring substrate 100. When the first conductor layer (12F) has a relatively large thickness, floating of the component mounting pad 120 from the first conductor layer (12F) due to moisture described above may be more effectively suppressed. By suppressing the floating of the component mounting pad 120 from the first conductor layer (12F), the flatness of the mounting surface of the electronic component (EC) can be satisfactorily ensured. A good quality component built-in wiring substrate can be provided in which the electronic component (EC) is precisely placed at a desired position. Further, through holes may be provided in the component mounting pad 120 for further dispersing moisture that may accumulate at the interface between the component mounting pad 120 and the first resin insulating layer (11F) to an upper side.

Next, a method for manufacturing the component built-in wiring substrate is described with reference to FIGS. 4A-4F using the component built-in wiring substrate 100 of FIG. 1 as an example.

Figure 4A:
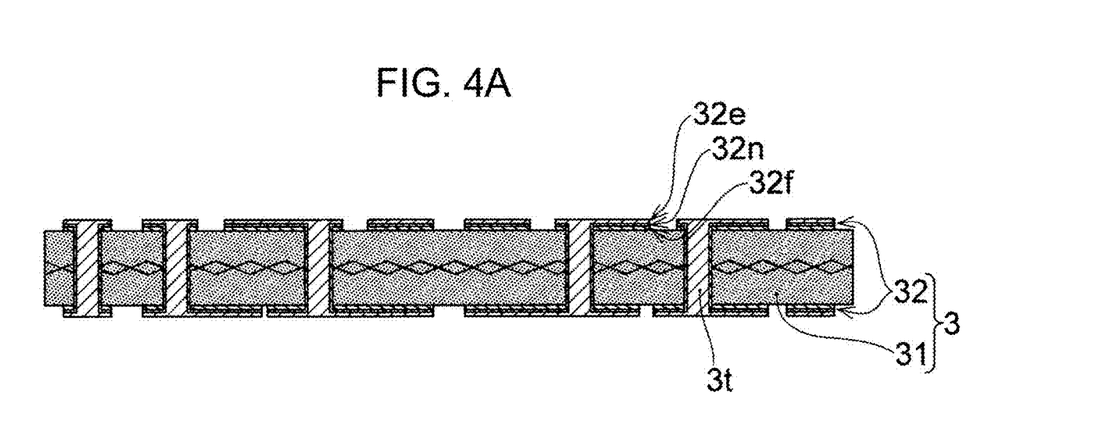
FIG. 4A is a cross-sectional view illustrating an example of a manufacturing process of a component built-in wiring substrate according to an embodiment of the present invention.

First, as illustrated in FIG. 4A, a starting substrate (for example, a double-sided copper-clad laminated plate) that includes a resin layer, which is to become the insulating layer 31 of the core substrate 3, and the metal foils (32f) that are respectively laminated on both sides of the resin layer is prepared, and the conductor layers 32 and the through-hole conductors (3t) of the core substrate 3 are formed. For example, through holes are formed at formation positions of the through-hole conductors (3t) by drilling or irradiation of $CO_2$ laser, and the metal film (32n) is formed in the through holes and on the metal foils (32f) by electroless plating or sputtering. Then, the plating film (32e) is formed by electrolytic plating using the metal film (32n) as a power feeding layer. As a result, the conductor layers 32, which each have a three-layer structure including the metal foil (32f), the metal film (32n) and the plating film (32e), and the through-hole conductors (3t), which each have a two-layer structure including the metal film (32n) and the plating film (32e), are formed. After that, the core substrate 3 having predetermined conductor patterns is obtained by patterning the conductor layers 32 using a subtractive method.

Figure 4B:
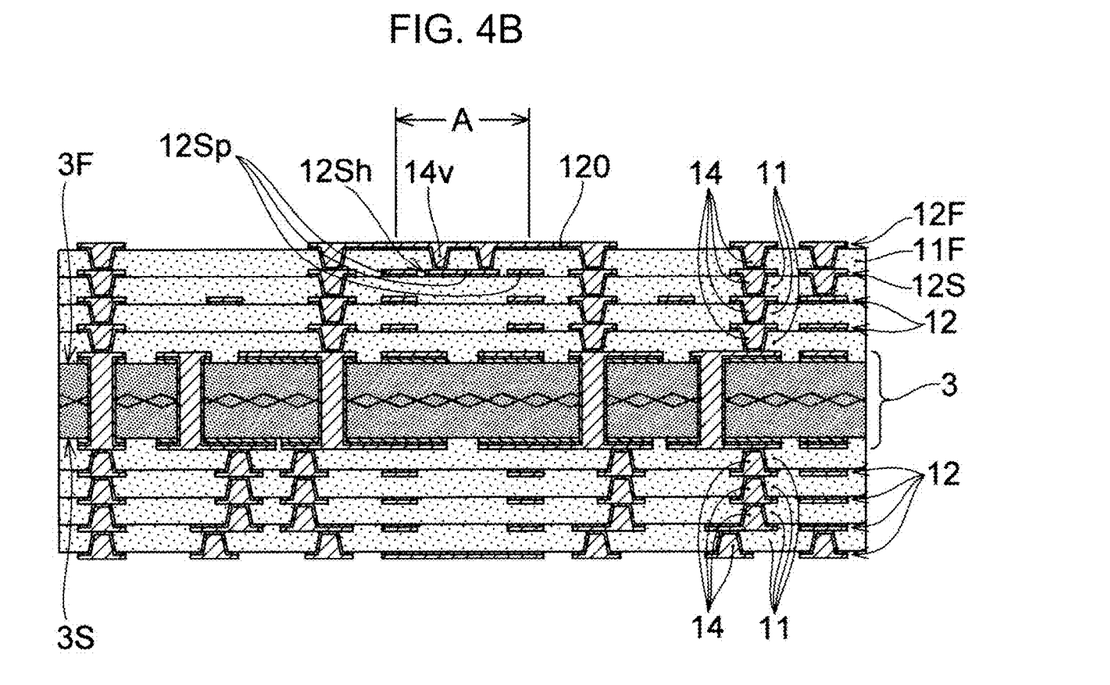
FIG. 4B is a cross-sectional view illustrating an example of a manufacturing process of the component built-in wiring substrate according to the embodiment of the present invention.

As illustrated in FIG. 4B, the resin insulating layers 11 and the conductor layers 12 are alternately formed on the first surface (3F) of the core substrate 3. The resin insulating layers 11 and the conductor layers 12 are alternately formed on the second surface (3S) of the core substrate 3. In FIG. 4B, three resin insulating layers 11, and two conductor layers 12 between the three resin insulating layers 11 are formed on each of the first surface (3F) and the second surface (3S), and after that, the second conductor layer (12S) that includes the second conductor pattern (12Sp) is formed on the first surface (3F) side, and a conductor layer 12 of a rank corresponding to that of the second conductor layer (12S) is formed on the second surface (3S) side. The term "rank" is a number assigned to each of the resin insulating layers 11 or the conductor layers 12 when the number that increases by 1 for each layer starting from the core substrate 3 side is sequentially assigned starting from 1 to each of the multiple resin insulating layers 11 or conductor layers 12 laminated on each of the first surface (3F) side and the second surface (3S) side. That is, in the illustrated example, a conductor layer 12 of a rank of 3 (the second conductor layer (12S)) is formed on the first surface (3F) side, and a conductor layer 12 of a rank of 3 is formed on the second surface (3S) side.

In the formation of each of the resin insulating layers 11, for example, a film-like epoxy resin is laminated on the core substrate 3 or on a resin insulating layer 11 and a conductor layer 12 that are formed earlier, and is heated and pressed. As a result, the resin insulating layers 11 are formed.

Through holes for forming the via conductors 14 are formed in the resin insulating layers 11, for example, by irradiation of $CO_2$ laser or the like. Then, the via conductors 14, which each include two layers, for example, a metal film and a plating film, are formed integrally with the conductor layers 12, which are respectively laminated directly above the insulating layers 11. The metal film is formed by electroless plating or sputtering on the entire surfaces of the resin insulating layers 11, which are bases of the conductor layers (12, 12S), and in the through holes formed in the resin insulating layers 11. The plating film is formed by pattern plating including electrolytic plating using the metal film as a power feeding layer. The via conductors 14 are formed in the through holes formed in the resin insulating layers 11. After that, unwanted portions of the metal film are removed by, for example, etching or the like. As a result, the conductor layers (12, 12S) each having a two-layer structure including predetermined conductor patterns are formed. The conductor layers 12 are each formed using any metal such as copper or nickel.

In the second conductor layer (12S), the solid pattern (second conductor pattern) (12Sp) is formed that extends over a region overlapping in a plan view a region where the component mounting pad 120 is to be formed. In the second conductor pattern (12Sp), the through holes (12Sh) are formed before the formation of the first resin insulating layer (11F). The through holes (12Sh) can be formed, for example, using the semi-additive method using pattern plating and etching during the formation of the second conductor layer (12S). It is also possible that the through holes (12Sh) are formed by laser irradiation. In this case, it is desirable that the laser used in the formation of the through holes (12Sh) penetrates the second conductor pattern (12Sp), which is formed of a metal such as copper, and on the other hand does not damage the resin insulating layer 11, which is mainly formed of an epoxy resin or the like. The laser used in the formation of the through holes (12Sh) can have a wavelength of, for example, about 500 nm or more and 560 nm or less. It is considered that, since laser having a wavelength in this range is unlikely to be absorbed by an epoxy resin or the like, the through holes (12Sh) can be formed without damaging the resin insulating layer 11.

Next, the first resin insulating layer (11F) is laminated on the second conductor layer (12S). Further, the conductor layer 12 (first conductor layer (12F)) having the component mounting pad 120 is formed on the upper surface (surface on the opposite side with respect to the core substrate 3) of the first resin insulating layer (11F), and at the same time, the via conductors (14v) that penetrate the first resin insulating layer (11F) and connect the component mounting pad 120 and the second conductor pattern (12Sp) are formed. On the second surface (3S) side, a resin insulating layer 11 is further laminated on the conductor layer 12 of a rank of 3, and the conductor layer 12 of a rank of 4 is further formed on the resin insulating layer 11.

The first conductor layer (12F) is formed to include the component mounting pad 120 that continuously extends over a predetermined region along the surface of the first resin insulating layer (11F) on the opposite side with respect to the core substrate 3. That is, during pattern plating for forming the first conductor layer (12F), a plating resist having an opening in a region corresponding to a region where the component mounting pad 120 is to be formed is used. The component mounting pad 120 is formed in a region including the component mounting region (A) in which the electronic component (EC) is to be placed. At the same time as the formation of the component mounting pad 120, the via conductors (14v) that connect the second conductor pattern (12Sp) and the component mounting pad 120 to each other are formed adjacent to the through holes (12Sh). The component mounting pad 120 that is to be included in the first conductor layer (12F) is integrally formed with the via conductors (14v) by the common metal film and plating film, and the second conductor pattern (12Sp) and the component mounting pad 120 are in a state of being connected to each other.

Figure 4C:
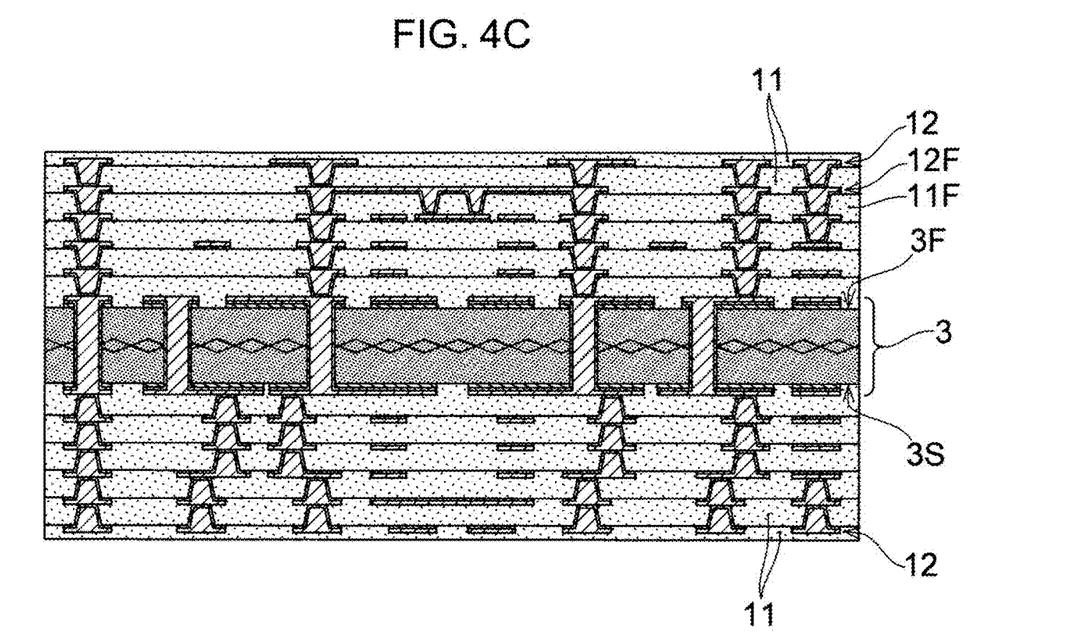
FIG. 4C is a cross-sectional view illustrating an example of a manufacturing process of the component built-in wiring substrate according to the embodiment of the present invention.

Next, as illustrated in FIG. 4C, two resin insulating layers 11 are formed on the first resin insulating layer (11F) and the first conductor layer (12F), and a conductor layer 12 sandwiched between the two resin insulating layers 11 is formed. Similarly, on the second surface (3S) side of the core substrate 3, two resin insulating layers 11 and a conductor layer 12 sandwiched between the two resin insulating layers 11 are further formed from the state of FIG. 4B.

Figure 4D:
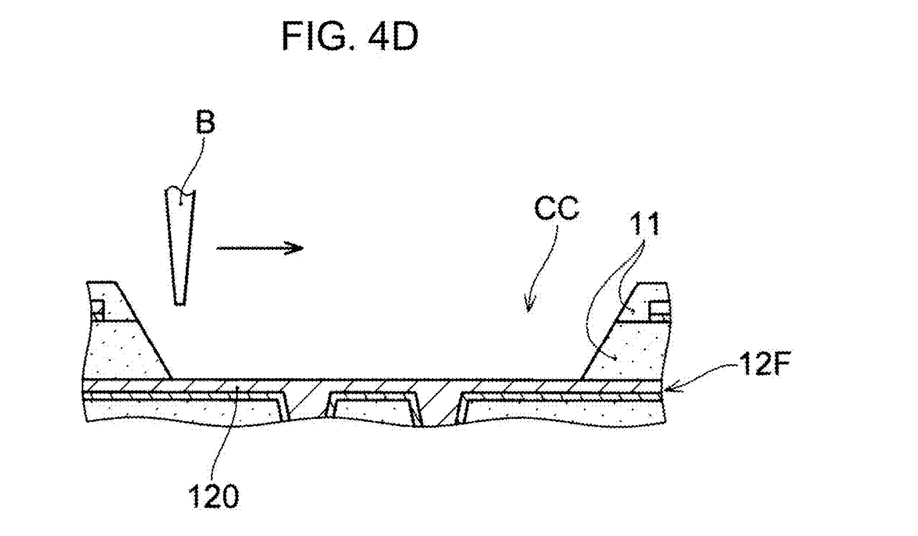
FIG. 4D is a cross-sectional view illustrating an example of a manufacturing process of the component built-in wiring substrate according to the embodiment of the present invention.

Subsequently, as illustrated in FIG. 4D, the component accommodating part (recess part) (CC) is formed that penetrate the two insulating layers 11 laminated on the first surface (3F) side in FIG. 4C and exposes a portion, specifically, the component mounting pad 120, of the first conductor layer (12F). FIG. 4D illustrates an enlarged view of only the recess part (CC) and a portion surrounding the recess part (CC). The recess part (CC) is formed, for example, by irradiating laser (B) from an outer side of an exposed surface of the resin insulating layer 11 while pitch feeding is performed. An example of the laser (B) is $CO_2$ laser. The component mounting pad 120 included in the first conductor layer (12F) is formed in an entire region including an entire bottom surface of the recess part (CC) in a plan view. Therefore, the component mounting pad 120 can function as a stopper for the laser (B) during the formation of the recess part (CC).

The method for forming the recess part (CC) is not limited to the irradiation of the laser (B). For example, it is also possible that the recess part (CC) is formed by drilling. Further, the recess part (CC) may be formed by positioning a release film (not illustrated in the drawings) on the component mounting pad 120, which is to become the bottom surface of the recess part (CC), and removing the resin insulating layer 11 and the conductor layer 12 laminated on the release film. After the formation of the recess part (CC), preferably, resin residues (smears) remaining in the recess part (CC) are removed by a plasma treatment or a treatment using a chemical solution containing permanganate or the like (desmear treatment).

Subsequently, when necessary, the surface of the component mounting pad 120 exposed in the recess part (CC) is roughened by a micro-etching process. Due to this roughening treatment, adhesion strength between the component mounting pad 120 and the adhesive (AD) provided on the component mounting pad 120 can be increased.

Figure 4E:
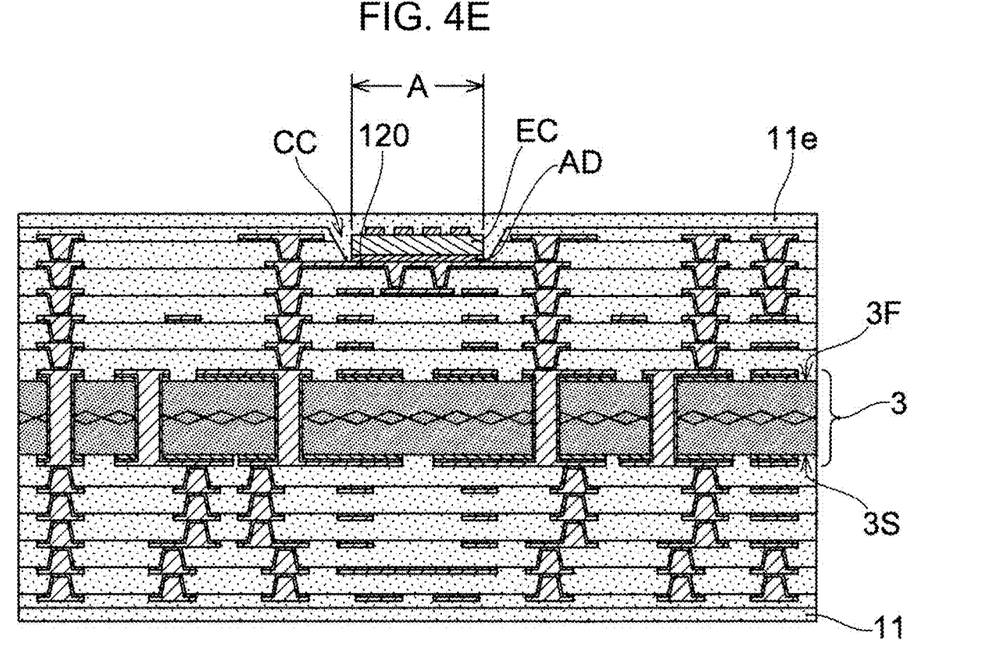
FIG. 4E is a cross-sectional view illustrating an example of a manufacturing process of the component built-in wiring substrate according to the embodiment of the present invention.

Subsequently, as illustrated in FIG. 4E, the electronic component (EC) is placed in the component mounting region (A) in the component mounting pad 120 exposed in the component accommodating part (CC). For example, a metal pellet of solder, copper, or the like, or a conductive or insulating paste, is supplied onto the component mounting pad 120 as the adhesive (AD) using a mounter or dispenser, and further, the electronic component (EC) is placed thereon using a die bonder or the like. As described above, the electronic component (EC) is, for example, an active component such as a semiconductor device, a passive component such as a resistor, or a wiring material including fine wirings. The electronic component (EC) and the adhesive (AD) are, for example, heated and pressed on the component mounting pad 120, and thereby, the adhesive (AD) is cured, and the electronic component (EC) is bonded to the component mounting pad 120. Further, after the electronic component (EC) is mounted, in order to improve adhesion between the electronic component (EC) and a resin insulating layer (11e) that covers the electronic component (EC), a surface of the electronic component (EC) may be roughened by a micro-etching process.

A resin insulating layer (sealing resin insulating layer) (11e) covering the electronic component (EC) is formed on the electronic component (EC), and the recess part (component accommodating part) (CC) is filled with a material of the resin insulating layer (11e). For example, a film-like epoxy resin or the like laminated during the formation of the sealing resin insulating layer (11e) flows into the component accommodating part (CC) due to heating and pressing. Then, the component accommodating part (CC) is filled with the material such as an epoxy resin forming the sealing resin insulating layer (11e). As a result, the electronic component (EC) is sealed in the recess part (CC). A resin insulating layer 11 is also formed on the outermost resin insulating layer 11 on the second surface (3S) side of the core substrate 3.

Figure 4F:
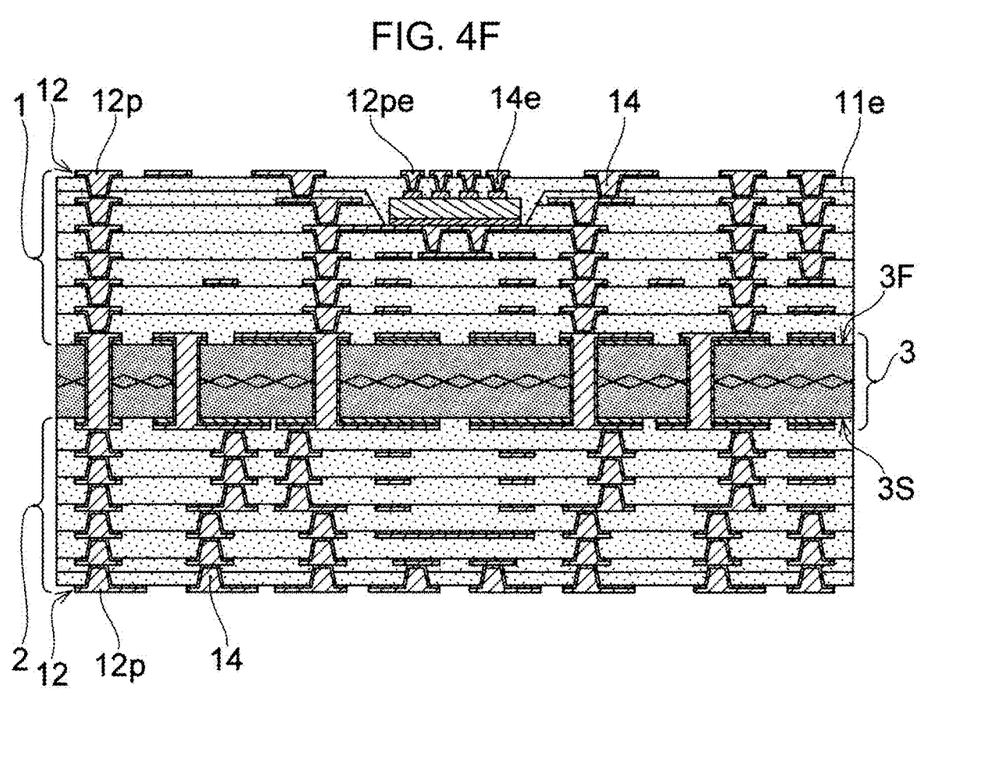
FIG. 4F is a cross-sectional view illustrating an example of a manufacturing process of the component built-in wiring substrate according to the embodiment of the present invention.

Subsequently, as illustrated in FIG. 4F, the via conductors (14, 14e) are formed in the sealing resin insulating layer (11e), and at the same time, the conductor layer 12 as the outermost conductor layer is formed on the resin insulating layer (11e). Similarly, the conductor layer 12 is formed on the outermost resin insulating layer 11 on the second surface (3S) side of the core substrate 3, and at the same time, the via conductors 14 penetrating the resin insulating layer 11 are formed. The connection pads (12p, 12pe) that can be used for connecting to an external circuit are provided in the outermost conductor layer 12 on the first surface (3F) side of the core substrate 3. The connection pads (12pe) are connected to the electrodes (E) of the electronic component (EC) by the via conductors (14e) penetrating the sealing resin insulating layer (11e) on the electronic component (EC). Connection pads (12p) are also provided in the outermost conductor layer 12 on the second surface (3S) side of the core substrate 3. The formation of the first build-up part 1 on the first surface (3F) side of the core substrate 3 and the formation of the second build-up part 2 on the second surface (3S) side of the core substrate 3 are completed.

The conductor layer 12 provided on the sealing resin insulating layer (11e) and the via conductors (14, 14e) penetrating the sealing resin insulating layer (11e) can be formed using the same method and the same material as the conductor layers 12 and the via conductors 14 described above. Regarding the formation of the via conductors (14e), through holes exposing the electrodes (E) of the electronic component (EC) are formed, for example, by irradiating ultraviolet (UV) laser from the surface of the resin insulating layer (11e) toward the electrodes (E). The through holes are filled with a plating film together with the formation of the conductor layer 12, and thereby, the conductor layer 12 and the via conductors (14e), which connect the connection pads (12pe) of the conductor layer 12 to the electrodes (E), are formed.

After that, the covering layers 13 (see FIG. 1) are formed on the outermost conductor layers 12 and the resin insulating layers 11 exposed from the conductor patterns of the conductor layers 12 of the first build-up part 1 and the second build-up part 2. Openings exposing the connection pads (12p, 12pe) are provided in the covering layers 13. Each of the covering layers 13 and the openings of the each of the covering layers 13 are formed by forming a resin layer containing a photosensitive epoxy resin or polyimide resin or the like, and performing exposure and development using a mask having appropriate opening patterns.

A surface protective film (not illustrated in the drawings) formed of Au, Ni/Au, Ni/Pd/Au, solder, heat resistant preflux, or the like may be formed by electroless plating, solder leveling, spray coating, or the like on the connection pads (12p, 12pe) exposed from the openings of the covering layers 13. Through the above processes, the component built-in wiring substrate 100 illustrated in FIG. 1 is completed.

In a process involving heating (for example, heating of a film-like resin to become a resin insulating layer 11, heating of the adhesive (AD), or the like) in the manufacture of the component built-in wiring substrate 100 described above, in particular, moisture adsorbed by a resin insulating layer 11 may vaporize and accumulate at an interface between a conductor layer 12 and the resin insulating layer 11. However, in the manufacture of the component built-in wiring substrate 100, the through holes (12Sh) are formed in the second conductor pattern (12Sp), which is a solid pattern extending in a planar direction of the resin insulating layer 11. Therefore, in a manufacturing process, local accumulation of moisture below the second conductor pattern (12Sp) is unlikely to occur. In the component built-in wiring substrate 100, occurrence of floating or peeling of the second conductor pattern (12Sp) from the resin insulating layer 11 in a manufacturing process is suppressed. Further, in particular, in a process of mounting the electronic component (EC) in the component accommodating part (CC), that is, placing the electronic component (EC) on the component mounting pad 120, a stress that can be applied to the component mounting pad 120 is unlikely to cause a defect due to a connection structure between the component mounting pad 120 and the second conductor pattern (12Sp) via the via conductors (14v). The stress is effectively dispersed without being concentrated on the component mounting pad 120, and occurrence of a defect such as peeling between the component mounting pad 120 and the first resin insulating layer (11F) in a manufacturing process is suppressed.

The component built-in wiring substrate of the embodiment is not limited to those having the structures illustrated in the drawings and those having the structures, shapes, and materials exemplified in the present specification. The component built-in wiring substrate can have first and second build-up parts that each contain any number of resin insulating layers and any number of conductor layers. The component built-in wiring substrate of the embodiment can have the component mounting pad 120 in a conductor layer 12 of any rank in the first build-up part 1. The first build-up part 1 and the second build-up part 2 that are respectively formed on the two sides of the core substrate 3 may have asymmetrical layer structures, and may have different numbers of resin insulating layers 11 and different numbers of conductor layers 12. Resin insulating layers 11 and conductor layers 12 may be further alternately laminated on an upper side of the resin insulating layer (11e), which seals the electronic component (EC) built into the component built-in wiring substrate in the component accommodating part (CC), and the conductor layer 12 on the resin insulating layer (11e).

In the electronic component built-in substrate described in Japanese Patent Application Laid-Open Publication No. 2016-39214, it is considered that peeling is likely to occur at an interface between the plane layer on which the electronic component is mounted and an insulating layer below the plane layer.

A component built-in wiring substrate according to an embodiment of the present invention includes: a first resin insulating layer that includes via conductors; a first conductor layer that is formed on the first resin insulating layer; a component accommodating part that is formed penetrating a resin insulating layer on the first conductor layer; a component mounting pad that is included in the first conductor layer and forms a bottom part of the component accommodating part; an electronic component that is placed on the component mounting pad; and a second conductor layer that is formed on the opposite side of the first resin insulating layer with respect to the first conductor layer. The component mounting pad is connected to the second conductor layer via the via conductors.

In a high quality component built-in wiring substrate according to an embodiment of the present invention, a defect such as peeling or floating of the component mounting pad from the resin insulating layer is unlikely to occur.

Obviously, numerous modifications and variations of the present invention are possible in light of the above teachings. It is therefore to be understood that within the scope of the appended claims, the invention may be practiced otherwise than as specifically described herein.

What is claimed is:

1. A component built-in wiring substrate, comprising:
   a first resin insulating layer;
   a first conductor layer formed on a first surface of the first resin insulating layer and including a component mounting pad;
   a second conductor layer formed on a second surface of the first resin insulating layer on an opposite side with respect to the first surface of the first resin insulating layer;
   a plurality of via conductors formed in the first resin insulating layer such that the plurality of via conductors is connecting the second conductor layer and the component mounting pad of the first conductor layer;
   a second resin insulating layer formed on the first resin insulating layer and having a component accommodating portion penetrating through the second resin insulating layer such that the component mounting pad is positioned at bottom of the component accommodating portion; and
   an electronic component positioned in the component accommodating portion of the second resin insulating layer such that the electronic component is mounted on the component mounting pad of the first conductor layer, wherein the first conductor layer is formed such that the component mounting pad has a solid pattern formed in an entire component mounting region at the bottom of the component accommodating portion.

2. The component built-in wiring substrate according to claim 1, further comprising:
a third resin insulating layer sealing the electronic component positioned in the component accommodating portion of the second resin insulating layer.

3. The component built-in wiring substrate according to claim 1, wherein the second conductor layer has a second conductor pattern that continuously extends over a region overlapping the component mounting pad such that the plurality of via conductors is connecting the component mounting pad and the second conductor pattern.

4. The component built-in wiring substrate according to claim 3, wherein the second conductor layer is formed such that the second conductor pattern has a plurality of through holes.

5. The component built-in wiring substrate according to claim 4, wherein the plurality of via conductors is formed such that the plurality of via conductors is positioned adjacent to the plurality of through holes formed in the second conductor pattern.

6. The component built-in wiring substrate according to claim 4, wherein the plurality of via conductors is positioned in a frame shape along a peripheral edge of the second conductor pattern, and the plurality of through holes are formed in a region surrounded by the plurality of via conductors.

7. The component built-in wiring substrate according to claim 4, wherein the plurality of via conductors and the plurality of through holes are alternately positioned in a grid pattern.

8. The component built-in wiring substrate according to claim 4, wherein the plurality of through holes is formed in a radial pattern from a center of the second conductor pattern.

9. The component built-in wiring substrate according to claim 4, further comprising:
a fourth resin insulating layer on which the first resin insulating layer and the second resin insulating layer are laminated; and
a third conductor pattern formed on the fourth resin insulating layer on an opposite side of the second conductor pattern such that the third conductor pattern is continuously extending over a region overlapping the second conductor pattern and has a plurality of through holes formed therein.

10. The component built-in wiring substrate according to claim 4, wherein the second conductor layer is formed such that each of the through holes in the second conductor pattern has a diameter of in a range of 150 μm to 300 μm.

11. The component built-in wiring substrate according to claim 1, wherein the first resin insulating layer includes a core material.

12. The component built-in wiring substrate according to claim 1, wherein the first conductor layer is a conductor layer having a largest thickness in the component built-in wiring substrate.

13. The component built-in wiring substrate according to claim 2, wherein the second conductor layer has a second conductor pattern that continuously extends over a region overlapping the component mounting pad such that the plurality of via conductors is connecting the component mounting pad and the second conductor pattern.

14. The component built-in wiring substrate according to claim 13, wherein the second conductor layer is formed such that the second conductor pattern has a plurality of through holes.

15. The component built-in wiring substrate according to claim 14, wherein the plurality of via conductors is formed such that the plurality of via conductors is positioned adjacent to the plurality of through holes formed in the second conductor pattern.

16. The component built-in wiring substrate according to claim 14, wherein the plurality of via conductors is positioned in a frame shape along a peripheral edge of the second conductor pattern, and the plurality of through holes are formed in a region surrounded by the plurality of via conductors.

17. The component built-in wiring substrate according to claim 14, wherein the plurality of via conductors and the plurality of through holes are alternately positioned in a grid pattern.

18. The component built-in wiring substrate according to claim 14, wherein the plurality of through holes is formed in a radial pattern from a center of the second conductor pattern.

19. The component built-in wiring substrate according to claim 14, further comprising:
a fourth resin insulating layer on which the first resin insulating layer and the second resin insulating layer are laminated; and
a third conductor pattern formed on the fourth resin insulating layer on an opposite side of the second conductor pattern such that the third conductor pattern is continuously extending over a region overlapping the second conductor pattern and has a plurality of through holes formed therein.

20. The component built-in wiring substrate according to claim 3, wherein the plurality of via conductors is positioned in a frame shape along a peripheral edge of the second conductor pattern.

* * * * *